United States Patent [19]
Manabe

[11] Patent Number: 6,097,054
[45] Date of Patent: *Aug. 1, 2000

[54] SEMICONDUCTOR MEMORY DEVICE AND METHOD OF MANUFACTURING THE SAME

[75] Inventor: Kazutaka Manabe, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/059,260

[22] Filed: Apr. 14, 1998

[30] Foreign Application Priority Data

Apr. 18, 1997 [JP] Japan .................................. 9-102192

[51] Int. Cl.$^7$ .................................................. H01L 27/108
[52] U.S. Cl. ............................................ 257/309; 257/797
[58] Field of Search ............................... 257/68, 71, 307, 257/300, 309, 296, 797

[56] References Cited

U.S. PATENT DOCUMENTS

| | | |
|---|---|---|
| 5,604,357 | 2/1997 | Hori ........................................... 257/68 |
| 5,705,838 | 1/1998 | Jost et al. .................................. 257/296 |
| 5,760,434 | 6/1998 | Zahurak et al. ........................... 257/309 |

FOREIGN PATENT DOCUMENTS

| | | |
|---|---|---|
| 5-82747 | 4/1993 | Japan . |
| 7-221034 | 8/1995 | Japan . |

*Primary Examiner*—David Hardy
*Attorney, Agent, or Firm*—McGinn & Gibb, P.C.

[57] ABSTRACT

In fabrication of a semiconductor memory device and especially a DRAM (dynamic random access memory) having an HSG-type stacked-capacitor structure, after a storage-node-forming silicon film has been surface-treated with an HSG preprocess using dilute fluoric acid, the storage-node-forming film on the sidewall surface of a storage-node-forming contact pattern at an accessory or alignment region is prevented from floating in the air and hence being peeled off, which would have lowered the yield. For this purpose, the storage-node-forming silicon film covers the sidewall surface of the contact pattern at the alignment region.

11 Claims, 11 Drawing Sheets

SEMICONDUCTOR MEMORY DEVICE AND METHOD OF MANUFACTURING THE SAME

BACKGROUND OF THE INVENTION

1. Field of the Invention

The present invention relates to a semiconductor memory device and more particularly to a dynamic random access memory (DRAM) having a stacked-capacitor structure in the form of an HSG (hemispherical grained). The invention relates also to a method of manufacturing a DRAM.

2. Description of the Related Art

In the manufacture of DRAMs each having a stacked-capacitor structure, a so-called HSG technology of providing the surface of a storage node in the form of a silicon film with hemispherical grains has recently been developed as one of various methods to increase a memory cell capacitance per unit area by making the surface of a storage node in the form of a stacked capacitor uneven.

In this HGS technology, as disclosed such as in Japanese Patent Laid-Open Publication No. hei7-221034, it is important to remove a natural oxide film off the surface of a silicon film immediately by whatever method before HSG treatment of the silicon film and to form a natural oxide film again after the first natural oxide film has been removed.

Consequently it has been a common practice to carry out, immediately before HSG processing, a surface treatment with dilute fluoric acid to remove the natural oxide film off the silicon film surface and then to terminate the resultant silicon film surface by hydrogen atoms.

Figure 5:
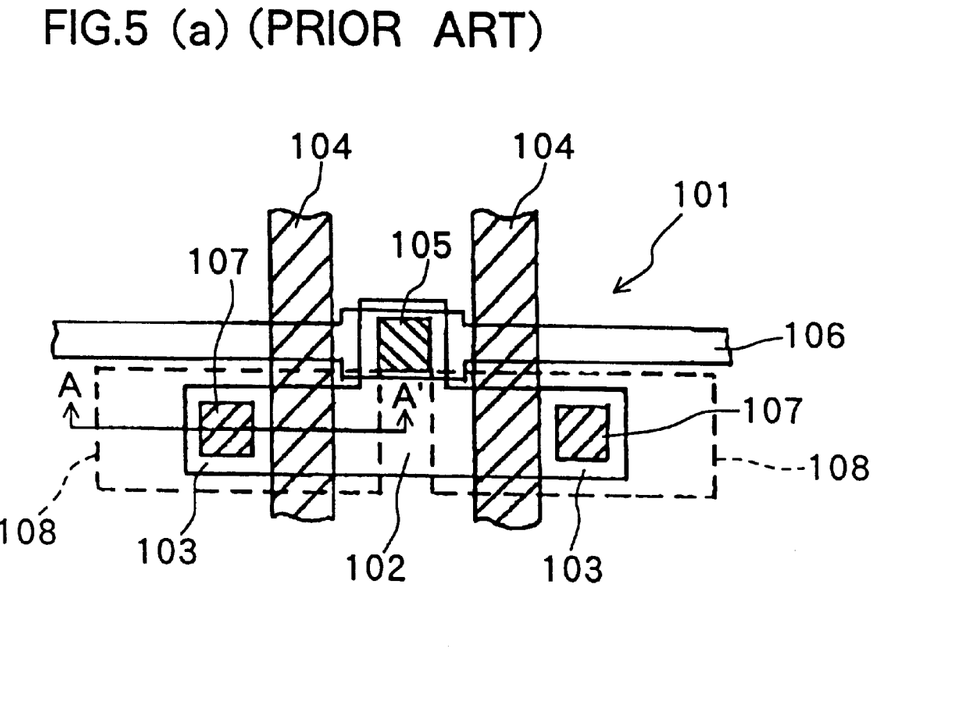
FIG. 5(a) is a schematic plan view of a conventional semiconductor memory device.
FIG. 5(b) is a schematic cross-sectional view taken along line A—A' of FIG. 5(a)

A memory cell and a memory-cell fabrication method utilizing this conventional HSG technology will now be described with reference to FIGS. 5(a), 5(b), 6(a)–6(d), 7(a), 7(b), 8(a), 8(b), 9(a) and 9(b) of the accompanying drawings of the present specification. Firstly, FIG. 5(a) shows a layout of the memory cell. In FIG. 5(a), reference number 101 designates an element isolation region; 102, 103, a source-drain region of a MOS transistor; 104, gate electrodes of the MOS transistor formed on a p-type silicon substrate 100 (FIG. 5(b) below) via a gate oxide film; 105, a bit contact; 106, a bit line; 107, storage-node contacts; 108, storage nodes. The entire cell region is covered with a plate electrode (described below in FIG. 8(b)).

Then the memory-cell fabrication method will be described. FIG. 5(b) shows a MOS transistor formed on a p-type silicon substrate 100.

Figure 6:
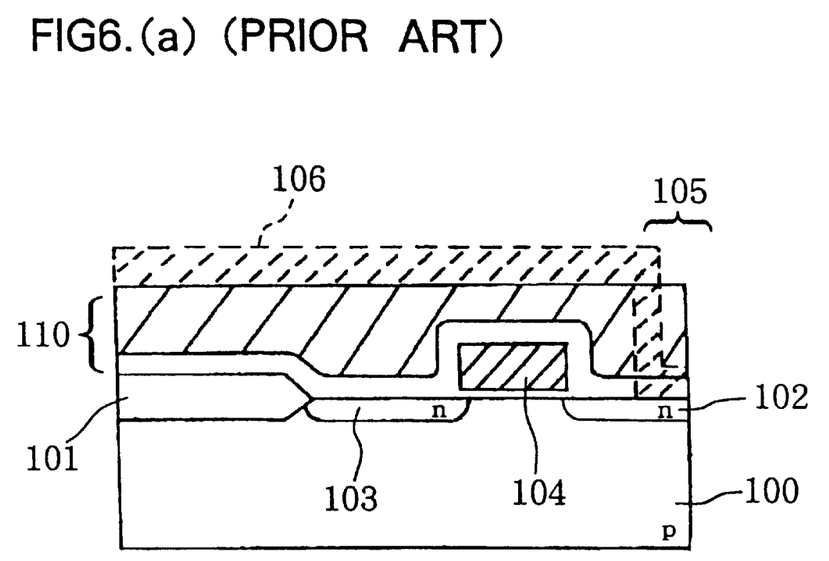

As shown in FIG. 6(a), to secure a good flatness of the substrate surface, an insulation film 110 chiefly of BPSG (boron-phospho-silicate glass) film is formed by CVD and is then treated with heat. When the BPSG film 110 is in direct contact with the substrate 100, phosphorus (P) or boron (Bo) diffuses out after the thermal treatment and, as a result, the sheet resistance of diffusion layer of the already formed source-drain region and the threshold voltage of the already formed transistor deviate off their set values. Consequently it has been customary to take a two-layer structure using a silicon oxide film for the lower layer.

Subsequently, a hole is formed in the bit contact 105 and also a tungsten silicide film as of 2000 angstroms thickness is formed, whereupon the tungsten silicide film is patterned into a desired pattern to form the bit line 106.

Then as shown in FIG. 6(b) a second silicon oxide film 111 as of 2000 angstroms is formed and also a second BPSG film 112 is formed in a 3000 angstroms thickness, and then a thermal treatment as of 900° C. takes place to cause reflow of the second BPSG film 112 in an effort to secure a flatness of the film surface. Further, a third silicon oxide film 113 as of 2000 angstroms is formed.

The third silicon oxide film 113 serves as a mask during a pretreatment (with dilute fluoric acid) process immediately before a subsequent HSG process. Specifically, because the etch rate of the BPSG film with dilute fluoric acid is about ten times that of the silicon oxide film, the most part of the second BPSG film 112 would be etched unless the third silicon oxide film 113 has to a large thickness enough to serve as a mask during the HSG pretreatment, thus lowering the yield markably. The second silicon oxide film 111 serves also to prevent the bit line 106 in the form of the patterned tungsten silicide from displaying due to possible stress simultaneously with reflow of the BPSG film during the thermal treatment of about 900° C. Yet the second silicon oxide film 111 would be essential to improve the reliability (especially corrosion-proofness to salt water) of a packaged device if tungsten silicide is used in the neighboring circuit region as a fuse of a redundancy circuit.

Then as shown in FIG. 6(c), a storage-node contact hole 114 is formed, and a buffered fluoric acid liquid and a Branson cleansing liquid are penetrated into the substrate as a pretreatment process before a phosphorus-doped silicon film is formed. The purpose of these process steps is to ensure an electrical connection between the substrate and the storage node and also to improve the yield partly because of the particle removal effect. At that time, partly because the sidewall surface of the storage-node-forming contact hole 114 is etched a little bit and partly due to the difference of etch rate between the silicon oxide film and the BPSG film, a dent and a lump of hundreds angstroms depth and height are formed. Then a phosphorus-doped silicon film as of 4000 angstroms thickness is formed and is patterned in a desired pattern and, as a result, un-HSG-treated storage nodes 108 are formed.

After that, as shown in FIG. 6(d), for removing a natural oxide film off the surfaces of the storage nodes 108 of phosphorus-doped silicon film and terminating the resultant silicon surface by hydrogen atoms, namely, for HSG treatment, the silicon film surface is treated with dilute fluoric acid and is HSG-treated by silane irradiation and annealing, thus forming on the surfaces of the storage nodes 108 a dent and a lump. Then a capacitance insulation film 115 and a plate electrode 116 of phosphorus-doped silicon film are formed, whereupon these two films are patterned in a desired pattern to obtain a COB-structure (capacitor-over-bitline-structure) memory cell.

Figure 7:
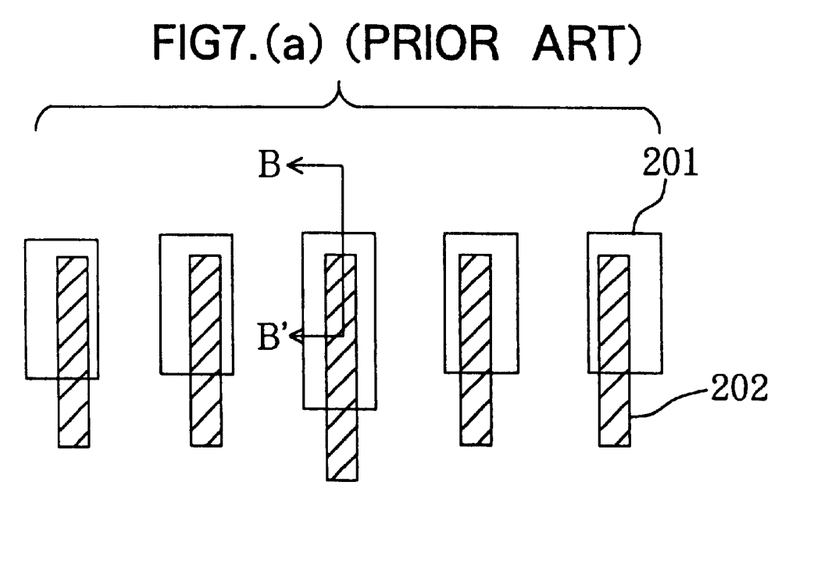
FIG. 7(a) is a schematic plan view showing projection and groove patterns formed in the alignment regions as mutually deviated in the conventional fabrication method.
FIG. 7(b) is a schematic cross-sectional view plan view showing a shape of the alignment region at an intermediate process step of the conventional fabrication method.

However, paying attention to the region except the memory cell, namely, alignment marks to be used in mask alignment and especially to verneir marks which are usually been used up to now, the following problems would be encountered with the conventional memory cell fabrication method using the above-mentioned HSG technology:

A layout of the vernier marks is shown in FIG. 7(a), in which 201 designates patterns to be formed simultaneously with the storage-node-forming masks, and 202, patterns to be formed simultaneously with the storage-node-forming masks.

In the alignment marks like the vernier marks, it has practically been that lower- and upper-layer patterns 201, 202, which should be aligned, overlap each other in part as shown in FIG. 7(a). This is because it is possible to take easy reading of a value of difference between the alignment-marking patterns 201, 202 by reading whether or not two patterns 201, 202 in every individual part overlap with each other.

Various problems with the conventional fabrication method are as follows. FIG. 7(b) is a schematic cross-sectional view showing the shape of the vernier region during the fabrication process corresponding to FIG. 6(b) and immediately after the third silicon oxide film 113 has been formed.

Figure 8A:
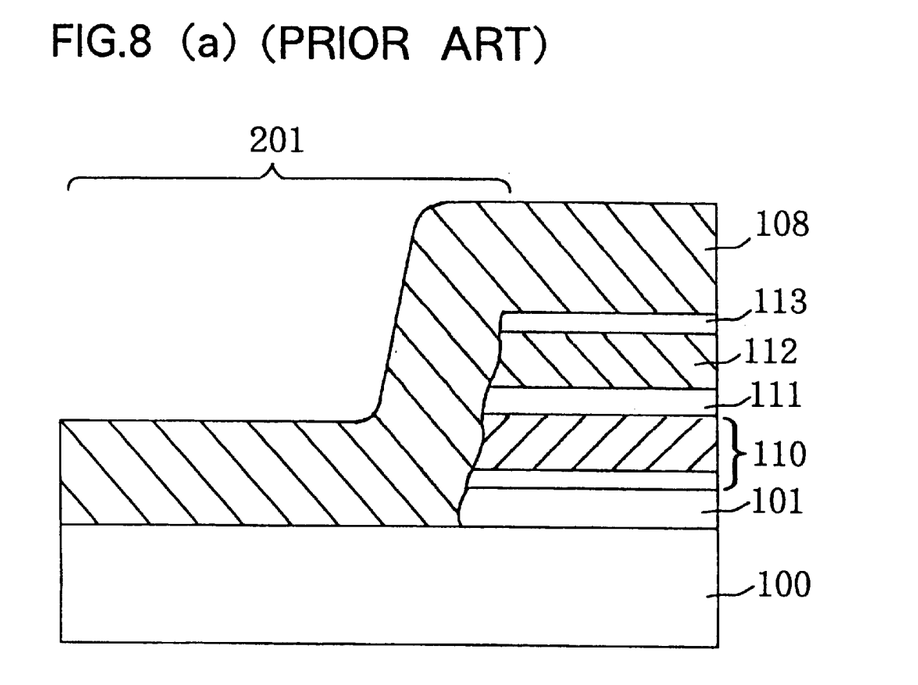
FIGS. 8(a) and 8(b) are enlarged schematic cross-sectional views taken along line B—B' of FIG. 7(a), illustrating a problem with the conventional art.

As shown in FIG. 8(a), a hole is formed in the pattern 201 of FIG. 7(a) in the vernier region (i.e., alignment region) simultaneously with the formation of the storage-node-forming contact hole 114. When the substrate 100 is dipped in a buffered fluoric acid liquid and a Branson cleansing liquid as a pretreatment before formation of the phosphorus-doped silicon film, the sidewall surface of the vervier-region pattern 201, like the memory-cell region, is etched a little bit and is thereby provided with a dent and a lump of hundreds angstroms depth and height. Then the phosphorus-doped silicon film 108 for formation of the storage nodes is formed also on the pattern 201.

Figure 8B:
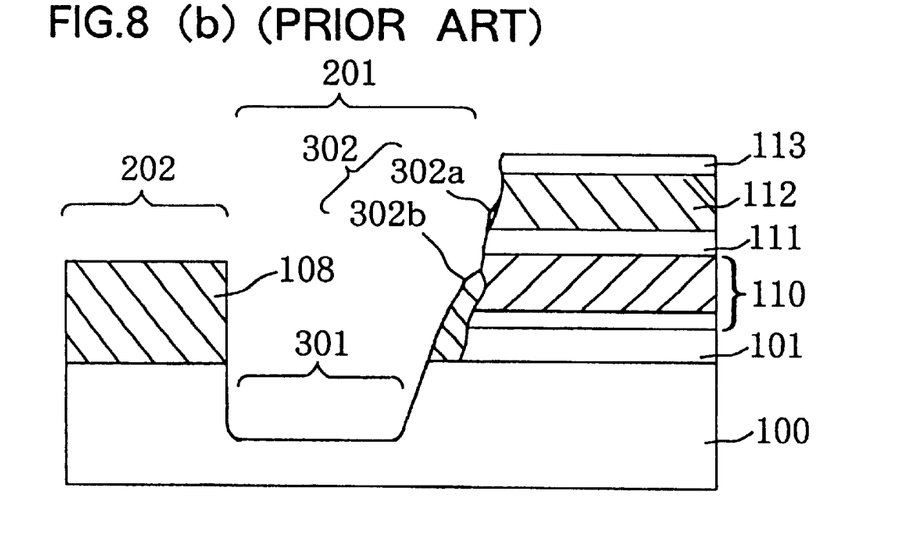

Then as shown in FIG. 8(b), simultaneously with patterning of the phosphorus-doped silicon film 108 for formation of the storage nodes, the phosphorus-doped film 108 of the vernier region also is patterned using the anisotropic dry etch technique to form the pattern 202 of FIG. 7(a). And in the substrate 100, a recess 301 is formed by overetching the storage nodes; at that time, the phosphorus-doped silicon film 108 of the recess's sidewall surface with a dent and a lump is etched and, as a result, a sidewall 302 of the phosphorus-doped silicon film 108 is formed on the sidewall surface of the recess 301. Further, since the sidewall surface of the recess 301 thus has a dent and a lump, a small sidewall 302a and a large sidewall 302b are formed apart from each other.

Figure 9:
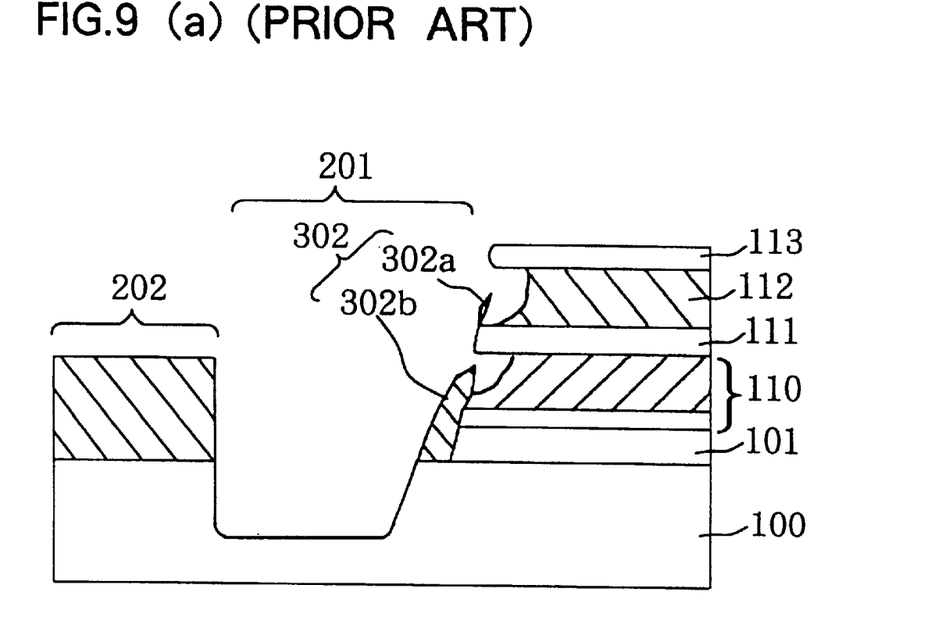
FIGS. 9(a) and 9(b) are enlarged schematic cross-sectional views similar to FIGS. 8(a) and 8(b), but illustrating another problem with the conventional art.

FIG. 9(a) shows the structure of FIG. 8(b) having been surface-treated with dilute fluoric acid. As described above, because the etch rate of the BPSG film with dilute fluoric acid is about ten times that of the silicon oxide film, etching of the BPSG films 110, 112 of sidewall surface of the recess 301 of the pattern 201 progresses from the portion uncovered with the sidewall 302. Therefore the small sidewall 302a almost floats in the air as shown in FIG. 9(a), and after the subsequent HSG treatment, this portion is peeled off (FIG. 9(b)) as process garbage, thus lowering the yield.

As long as the BPSG film is not etched during the HSG pretreatment, the sidewall 302 only remains on the sidewall surface of the recess 301 in the pattern 201 without being peeled off. Actually, however, the sidewall 302 was peeled as the HSG pretreatment used dilute fluoric acid. Nevertheless the HSG pretreatment with dilute fluoric acid is indispensable for formation of good HSG-type storage nodes.

SUMMARY OF THE INVENTION

It is therefore an object of the present invention to provide a semiconductor memory device in which a sidewall is free from being peeled off, thus preventing the yield from lowering.

Another object of the invention is to provide a method of manufacturing the semiconductor memory device described in the previous paragraph.

According to a first aspect of the present invention, the above first object is accomplished by a semiconductor memory device comprising: a semiconductor substrate; a plurality of accessory patterns disposed on the semiconductor substrate; and a plurality of storage nodes in the form of an HSG (hemispherical grained) silicon film pretreated with an HSG preprocess using chiefly dilute fluoric acid as an etching liquid, the silicon film covering at least sidewall surfaces of the accessory patterns.

Preferably, the accessory patterns adjoin respectively a plurality of memory-cell regions of the semiconductor substrate, and each of the accessory patterns has a double-layer structure composed of: a first accessory pattern formed in an accessory-pattern region when contact holes for formation of the storage nodes are formed one in each memory cell region; and a second accessory pattern formed of the silicon film deposited so as to cover the first accessory pattern when the silicon film is filled in each of the contact and is shaped into a storage-node form.

Further, the first accessory pattern is formed as a groove pattern, and the second accessory pattern is formed as a projection pattern. And the silicon forming the projection pattern covers a sidewall surface of the groove pattern.

As an alternative, only part of the first accessory pattern is covered with the silicon film shaped in the storage-node form, and a sidewall surface of the first accessory pattern is wholly covered with the silicon film shaped in the storage-node form.

Preferably, the substrate is dipped in a buffered fluoric acid and a Branson cleaning liquid as the preprocess before the phosphorus-doped silicon film is formed. And the silicon film is a phosphorus-doped silicon film.

According to a second aspect of the invention, the above second object is accomplished by a method of manufacturing a semiconductor memory device, which includes a semiconductor substrate, a plurality of accessory patterns disposed on the substrate, and a plurality of storage nodes in the form of HSG (hemispherical grained) silicon film pretreated with an HSG preprocess using chiefly a dilute fluoric acid as an etching liquid, the method comprising the steps of: forming storage-node-forming contact holes in the semiconductor substrate; forming a film of storage-node-forming semiconductor material on the semiconductor substrate over the accessory patterns and the storage-node-forming contact holes; and patterning the film of storage-node-forming semiconductor material, which is formed over the storage-node-forming contact holes, so as to cover sidewall surfaces of the accessory patterns.

Preferably, the accessory patterns adjoin respectively to a plurality of memory-cell regions of the semiconductor substrate, and each of the accessory patterns on the semiconductor substrate has a double-layer structure composed of first and second accessory patterns, the patterning step including: forming the first accessory patterns one in each of a plurality of accessory regions adjacent to the respective memory-cell regions during the forming of the storage-node-forming contact holes; forming the film of storage-node-forming semiconductor material over the first accessory patterns at the accessory-pattern regions and the memory-cell regions as well; and forming the second accessory patterns by patterning the film of storage-node-forming semiconductor material in the accessory-pattern regions in a shape such as to cover the sidewall surfaces of the first accessory patterns.

According to a third aspect of the invention, the above second object is accomplished alternatively by a method of manufacturing a semiconductor memory device, which includes a semiconductor substrate, a plurality of accessory patterns disposed on the substrate, and a plurality of storage nodes in the form of HSG (hemispherical grained) silicon film pretreated with an HSG preprocess using chiefly a dilute fluoric acid as an etching liquid, the method comprising the steps of: forming storage-node-forming contact holes in the semiconductor substrate; forming a film of storage-node-forming semiconductor material on the semiconductor substrate over the accessory patterns and the storage-node-forming contact holes; and patterning the film of storage-node-forming semiconductor material, which is formed over the storage-node-forming contact holes, in such manner that a continuous sidewall of the storage-node-forming semiconductor material is formed at a sidewall surface of each of the accessory patterns.

As mentioned above, according to the conventional art, since the projection pattern as the second accessory pattern is formed at a position off the sidewall surface of the groove pattern as the first accessory pattern, the sidewall of the groove pattern would be peeled off as process trash.

Whereas in the present invention, to eliminate this sidewall peeling, the projection pattern of the storage-node-forming film is formed so as to cover the sidewall surface of the groove pattern.

BRIEF DESCRIPTION OF THE DRAWINGS

The above and other objects, advantages and features of the present invention will be more apparent from the following description taken in conjunction with the accompanying drawings in which:

FIGS. 6(a) to 6(d) are schematic cross-sectional views showing a process sequence of a conventional fabrication method for the conventional semiconductor memory device;

DETAILED DESCRIPTION OF THE PREFERRED EMBODIMENTS

The principles of the present invention are particularly useful when applied to a semiconductor memory device and its fabrication method, a couple preferred embodiments of which will now be described in detail with reference to the accompanying drawings.

Figure 1:
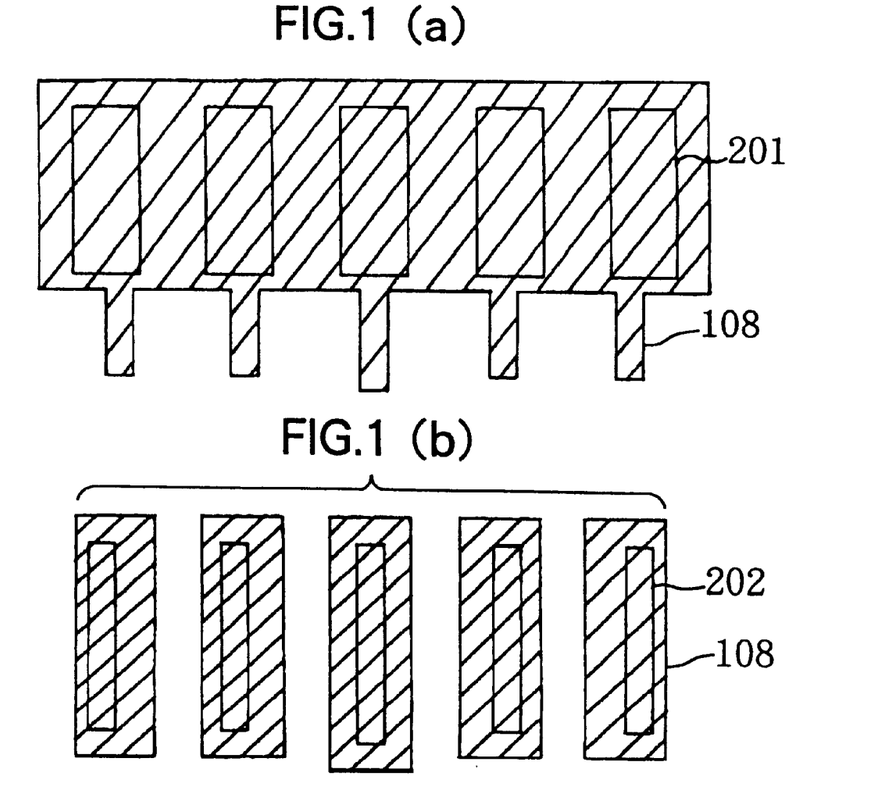
FIG. 1(a) is a schematic plan view showing projection patterns formed in the respective alignment regions in a semiconductor memory device according to a first embodiment of the present invention.
FIG. 1(b) is a schematic plan view showing a groove pattern formed in the alignment region in the semiconductor memory device of the first embodiment.

First Embodiment:

FIGS. 1(a) and 1(b) are schematic plan views of first and second alignment marks, respectively, to be used in a semiconductor memory device according to a first embodiment of the present invention.

The semiconductor memory device of the first embodiment has on a semiconductor memory device a plurality of memory-cell regions and an a plurality of accessory-pattern regions (hereinafter called the alignment regions) located one adjacent to each memory-cell region. In this embodiment, the first and second alignment (positioning) marks will be explained as first and second accessory patterns.

The first alignment marks, as shown in FIG. 1(a), are to be formed one in each alignment region as a groove pattern 201 when storage-node-forming contact holes are formed one in each memory-cell region.

The second alignment marks, as shown in FIG. 1(b), are to be formed one in each alignment region as a protrusion pattern 202 of storage-node-forming film (indicated by diagonal lines) 108 deposited over a sidewall surface of every groove pattern 201 when a film to be filled in every storage-node-forming contact hole is formed in a prospective storage-node shape.

In this embodiment, the groove and protrusion patterns 201, 202 simultaneously formed using a storage-node-forming mask are wholly covered with the storage-node-forming film 108, no sidewall would be formed on any of the sidewall surfaces of the groove and protrusion patterns 201, 202 by the storage-node-forming film 108, so that any trash of peeled sidewall pieces would happen to develop even during the process of formation of prospective HSG-type storage nodes.

Figure 2:
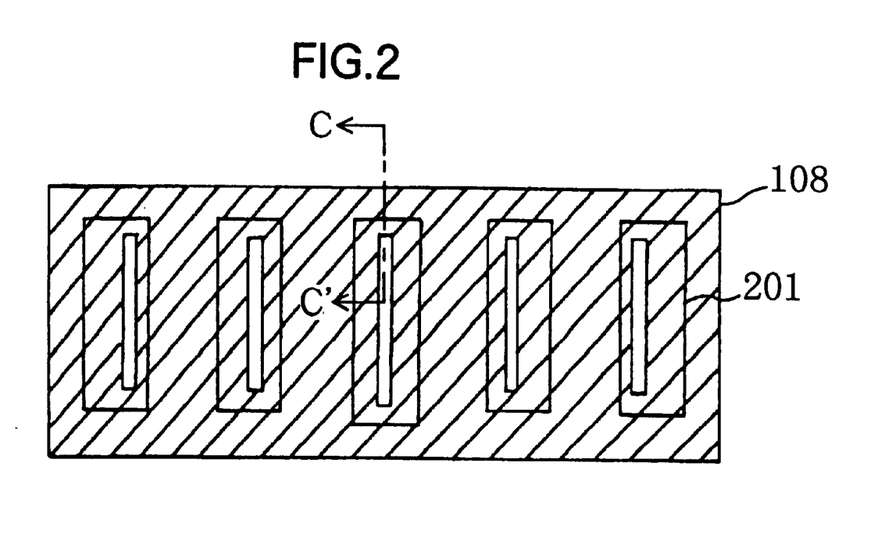
FIG. 2 is a schematic plan view showing a modification of the pattern of the first embodiment.

FIG. 2 shows a modification of the first embodiment. In this modification, because, although the groove patterns 201 is only partly covered with the storage-node-forming film 108, the sidewall surfaces of the groove patterns 201 to be simultaneously formed using the storage-node-forming mask are wholly covered with the storage-node-forming film 108, no sidewall peeling would happen to occur even during the process of formation of prospective HSG-type storage nodes likewise in the first embodiment of FIGS. 1(a) and 1(b).

Figure 3:
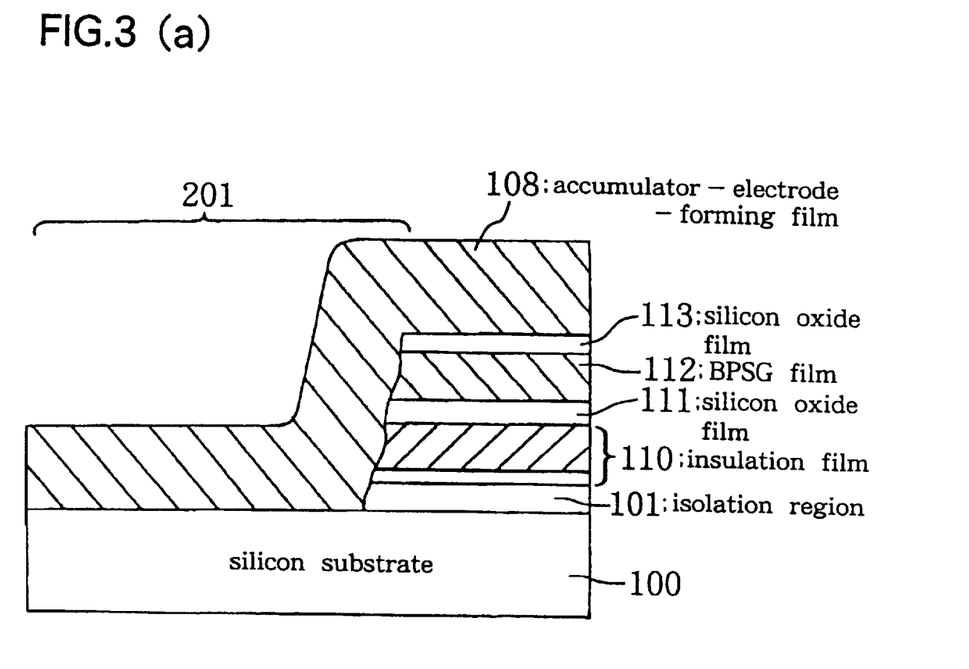
FIGS. 3(a) to 3(b) are fragmentary schematic cross-sectional views showing a process sequence of a first fabrication method according to the first embodiment.

A fabrication method for the semiconductor memory device of the foregoing embodiment will now be described with reference to FIGS. 3(a) to 3(b). FIGS. 3(a) and 3(b) are enlarged schematic cross-sectional views taken along line C—C', showing a process sequence of the fabrication.

FIG. 3(a) shows the same process step as that of FIG. 8(a) of the conventional technology. As shown in FIG. 3(a), to form a storage-node-forming contact hole at a memory-cell region in a multilayer insulator film, a groove pattern 201 is formed at the alignment region and then a substrate 100 is dipped in a buffered fluoric acid and a Branson cleaning liquid as a pretreatment before formation of a phosphorus-doped silicon film 108, whereupon the phosphorus-doped silicon film 108 for a prospective storage node is formed as the groove pattern 201 at the alignment region including the memory-cell region.

Then as shown in FIG. 3(b), at the alignment region, the phosphorus-doped silicon film 108 for formation of a prospective storage node is patterned in a shape of the projection pattern 202 of FIG. 2. At that time, since the storage-node-forming film 108 on the sidewall surface of the groove pattern 201 corresponding a storage-node-contact pattern at the alignment region is not etched, no sidewall of the storage-node-forming film 108 would be formed on the sidewall surface. Specifically, at the alignment region, the phosphorus-doped silicon film 108 for formation of a prospective storage node is patterned so as to cover the sidewall surface of the groove pattern and, therefore, no sidewall peeling of the phosphorus-doped silicon film 108 would happen to occur. In this embodiment, like the conventional art, although an overetched portion 304 would exist in a silicon substrate 100 as the result of overetching of the prospective storage node, this portion 304 would give no bad influence on the yield.

Figure 4:
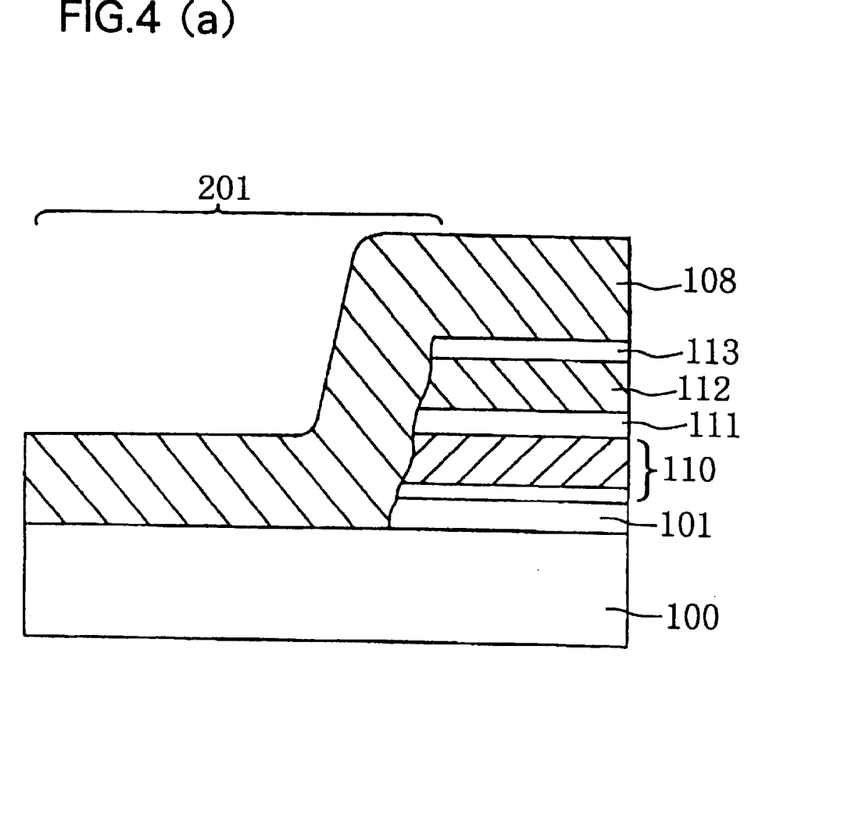
FIGS. 4(a) and 4(d) are fragmentary schematic cross-sectional views showing a process sequence of a second fabrication method according to a second embodiment.

Second Embodiment:

FIGS. 4(*a*) and 4(*b*) are schematic cross-sectional views showing a process sequence of a fabrication method according to a second embodiment.

FIG. 4(*a*) shows the same process step corresponding to that of FIG. 10(*a*) of the conventional technology. As shown in FIG. 4(*a*), to form a storage-node-forming contact hole at a memory-cell region in a multilayer insulator film, a groove pattern 201 is formed at the alignment region and then a substrate 100 is dipped in a buffered fluoric acid and a Branson cleaning liquid as a pretreatment before formation of a phosphorus-doped silicon film 108. At that time, the sidewall surface of the groove pattern 201 is etched a little bit to form a dent and a lump, whereupon the phosphorus-doped silicon film 108 for a prospective storage node is formed so as to cover the memory-cell region and the alignment region.

Then as shown in FIG. 4(*b*), simultaneously with patterning of the phosphorus-doped silicon film 108 for formation of the prospective storage node, at the alignment region, the phosphorus-doped silicon film 108 is patterned in a shape of the projection pattern 202. At that time, since the storage-node-forming film 108 on the sidewall surface of the groove pattern 201 corresponding to a storage-node-contact pattern at the alignment region is etched, a sidewall 108*a* of the storage-node-forming film 108 would be formed on the sidewall surface. The etching condition of this storage-node material is controlled such that no etching residue would occur and that the sidewall 108*a* formed on the dent-and-lump irregular sidewall surface would be continuous without being separated at the boundary of the dent and lump portions.

Subsequently, as shown in FIG. 4(*c*), a surface treatment with dilute fluoric acid is carried out. At that time, etching of the BPSG films 110, 112 at the sidewall surface of the groove pattern 201 with dilute fluoric acid progresses from that portion left uncovered with the storage-node-forming film 108. Nonetheless, as shown in FIG. 4(*d*), a single continuous piece of the storage-node-forming film 108 is in intimate contact with the silicon substrate 100 and the silicon oxide films 101, 111 as well and, therefore, any part of this sidewall portion would not float in the air and would not happen to be peeled off even after a subsequent HSG-treatment.

In the foregoing embodiments, the accessory patterns are the alignment marks for positioning. These accessory patterns should by no means be limited to the alignment marks and may be vernier patterns, box patterns, etching patterns or various other patterns.

According to the present invention, since the sidewall surface of the individual accessory pattern is covered the storage-node-forming film, no sidewall would be formed on the sidewall surface of the accessory pattern even immediately after a surface treatment with dilute fluoric acid has been carried out as HSG pretreatment, so that the yield can be prevented from lowering due to the possible sidewall peeling.

Further, since the storage-node semiconductor material formed over the storage-node-forming contact is patterned so as to form a continuous sidewall in intimate contact with the sidewall surface of the accessory pattern, no piece of the sidewall would float in the air as process garbage, so that the yield can be prevented from lowering due to the possible sidewall peeling.

It is thus apparent that the present invention should by no means be limited to the illustrated embodiment and various modifications and changes may be suggested without departing from the scope and spirit of the invention.

Finally, the present application claims the priority of Japanese Patent Application No. Hei9-102192 filed on Apr. 18, 1997, which is herein incorporated by reference.

What is claimed is:

1. A semiconductor memory device comprising:

a semiconductor substrate;

one or more memory-cell regions including a plurality of storage nodes being formed on said semiconductor substrate, each of said storage nodes having an HSG (hemispherical grained) silicon film pretreated with an HSG preprocess using dilute fluoric acid as an etching liquid; and one or more accessory pattern regions disposed outside said memory-cell regions on said semiconductor substrate, said accessory pattern regions including a plurality of first accessory patterns and one or more second accessory patterns disposed corresponding to said plurality of first accessory patterns, each of said first accessory patterns comprising a groove pattern in a condition in which contact holes for formation of said storage nodes have been formed in said memory cell regions, and said second accessory patterns formed of said HSG silicon film deposited so as to cover at least all parts of a sidewall surface of each of said first accessory patterns, and thereby so as not to expose any part of said sidewall surface of each of said first accessory patterns to said etching liquid when said HSG silicon film is filled in each of said contact holes and is shaped into said storage nodes.

2. The semiconductor memory device according to claim 1, wherein said one or more second accessory patterns are formed of said HSG silicon film deposited so as to cover the entire area of each of said first accessory patterns, and thereby so as not to expose any part of said sidewall surface of each of said first accessory patterns to said etching liquid when said HSG silicon film is filled in each of said contact holes and is shaped into said storage nodes.

3. The semiconductor memory device according to claim 1, wherein said accessory pattern regions adjoin respectively said memory-cell regions.

4. The semiconductor memory device according to claim 1, wherein said second accessory patterns respectively comprise projection patterns.

5. The semiconductor memory device according to claim 1, wherein said HSG silicon film comprises a phosphorus-doped silicon film.

6. The semiconductor memory device according to claim 1, wherein said substrate is dipped in a buffered fluoric acid and a Branson cleaning liquid as said preprocess before said phosphorus-doped silicon film is formed.

7. A semiconductor memory device comprising:

a semiconductor substrate;

one or more memory-cell regions including a plurality of storage nodes being formed on said semiconductor substrate, each of said storage nodes having an HSG (hemispherical grained) silicon film pretreated with an HSG preprocess using dilute fluoric acid as an etching liquid; and one or more accessory pattern regions disposed outside said memory-cell regions on said semiconductor substrate, said accessory pattern regions including a plurality of first accessory patterns and one or more second accessory patterns disposed corresponding to said plurality of first accessory patterns, each of said first accessory patterns comprising a groove pattern in a condition in which contact holes for formation of said storage nodes have been formed in said memory cell regions, and each of said second accessory patterns formed of said HSG silicon film being patterned to form a continuous sidewall in intimate contact with almost all parts of a sidewall surface of each of said first accessory patterns so as not to expose almost any part of said sidewall surface of each of said first accessory patterns to said etching liquid when said HSG silicon film is filled in each of said contact holes and is shaped into said storage nodes.

8. The semiconductor memory device according to claim 7, wherein said accessory pattern regions adjoin respectively said memory-cell regions.

9. The semiconductor memory device according to claim 7, wherein said second accessory patterns respectively comprise projection patterns.

10. The semiconductor memory device according to claim 7, wherein said HSG silicon film comprises a phosphorus-doped silicon film.

11. The semiconductor memory device according to claim 7, wherein said substrate is dipped in a buffered fluoric acid and a Branson cleaning liquid as said preprocess before said phosphorus-doped silicon film is formed.

* * * * *